(12) United States Patent  
Terwal

(10) Patent No.: US 8,908,887 B2
(45) Date of Patent: Dec. 9, 2014

(54) MULTI-CHANNEL CLASS-D AUDIO AMPLIFIER WITH PLANAR INDUCTORS

(75) Inventor: Remco Terwal, West Newton, MA (US)

(73) Assignee: Bose Corporation, Framingham, MA (US)

( * ) Notice: Subject to any disclaimer, the term of this patent is extended or adjusted under 35 U.S.C. 154(b) by 435 days.

(21) Appl. No.: 13/213,135

(22) Filed: Aug. 19, 2011

(65) Prior Publication Data

US 2013/0044895 A1 Feb. 21, 2013

(51) Int. Cl.
*H03F 99/00* (2009.01)
*H03F 3/217* (2006.01)
*H03F 3/68* (2006.01)

(52) U.S. Cl.
CPC . *H03F 3/217* (2013.01); *H03F 3/68* (2013.01)
USPC ............................ 381/121; 381/120; 381/94.1

(58) Field of Classification Search
CPC ..... H03F 3/217; H03F 3/2178; H03F 3/2173; H03F 3/68
See application file for complete search history.

(56) References Cited

U.S. PATENT DOCUMENTS

| | | | |
|---|---|---|---|
| 6,658,265 B1 * | 12/2003 | Steel et al. | ................. 455/553.1 |
| 7,986,187 B1 | 7/2011 | Nussbaum et al. | |
| 2007/0139151 A1 | 6/2007 | Nussbaum et al. | |
| 2007/0229159 A1 * | 10/2007 | Krishnan et al. | ............. 330/253 |

OTHER PUBLICATIONS

International Preliminary Report on Patentability dated Mar. 6, 2014 for International application No. PCT/US2012051155.

* cited by examiner

*Primary Examiner* — Joseph Saunders, Jr.
*Assistant Examiner* — James Mooney

(57) ABSTRACT

An apparatus for providing an audio signal to drive a speaker system includes first and second audio channels. The first audio channel has a first class-D amplifier for receiving an input signal, and a first reconstruction filter for receiving an output from the first class-D amplifier and reconstructing therefrom an output audio signal for driving the speaker system. The second audio channel has a second class-D amplifier for receiving an input audio signal, and a second reconstruction filter for receiving an output from the second class-D amplifier and reconstructing therefrom an output audio signal for driving the speaker system. The first and second reconstruction filters have corresponding first and second planar inductors, with the second planer inductor being magnetically coupled to the first planar inductor.

17 Claims, 4 Drawing Sheets

MULTI-CHANNEL CLASS-D AUDIO AMPLIFIER WITH PLANAR INDUCTORS

FIELD OF DISCLOSURE

This invention relates to audio amplifiers, and in particular, to class D amplifiers.

BACKGROUND

Because of their high efficiency, class D amplifiers are particularly useful for portable and compact audio applications, such as in automotive applications.

A typical class D amplifier system 10, shown in FIG. 1, features a class-D audio amplifier 12 that transforms an incoming audio signal 14, which can be analog or digital, into an amplified pulse-coded representation of that incoming signal, hereafter referred to as the amplifier output 16. A reconstruction filter 22 converts this amplifier output 16 into a corresponding analog audio signal 20, which can then be used to drive a speaker 18. This process is carried out by a reconstruction filter 22. An important component of this reconstruction filter 22 is an inductor.

Inexpensive and coupled or uncoupled compact planar inductors 24, such as that shown in FIG. 2 can be used in reconstruction filters 22 of class-D amplifier systems 10. A planar inductor 24 typically includes a printed circuit board 26 having concentric traces 28 that function as the windings of the inductor. First and second low-reluctance structures 30, 32 resting on opposing sides of the printed circuit boards function as the core of the inductor 24. Typical low-reluctance structures 30, 32 often comprise but are not limited to a ferromagnetic material, such as powdered iron, or ferrite. In an effort to linearize the change in inductance as a function of frequency, such structures often incorporate air gaps. These air gaps can result in cross-talk caused by magnetic linkage between nearby inductors.

SUMMARY

The invention is based on the recognition that cross-talk between nearby planar inductors can be significantly mitigated by proper feedback. As a result, the invention makes it possible to construct amplifiers having small footprints with inexpensive planar inductors.

In one aspect, the invention features an apparatus for providing an audio signal to drive a speaker system. Such an apparatus includes first and second audio channels. The first audio channel has a first class-D amplifier for receiving an input signal, and a first reconstruction filter for receiving an output from the first class-D amplifier and reconstructing therefrom an output audio signal for driving the speaker system. The second audio channel has a second class-D amplifier for receiving an input audio signal, and a second reconstruction filter for receiving an output from the second class-D amplifier and reconstructing therefrom an output audio signal for driving the speaker system. The first and second reconstruction filters have corresponding first and second planar inductors, with the second planer inductor being magnetically coupled to the first planar inductor.

Some embodiments of the apparatus also include a first feedback loop for providing a signal from an output of the first reconstruction filter back to the first class-D amplifier. Among these embodiments are those that also include a second feedback loop for providing a signal from an output of the second reconstruction filter back to the second class-D amplifier.

Yet other embodiments further include means for reducing distortion due to magnetic coupling between the first and second planar inductors. Among these are those in which the means for reducing distortion includes means for providing feedback from the first reconstruction filter to the first class-D amplifier. These latter embodiments also include those in which the means for reducing distortion further includes means for providing feedback from the second reconstruction filter to the second class-D amplifier.

Also included among the embodiments of the apparatus are those in which the first class-D amplifier includes a first output for providing a first signal, a second output for providing a second signal modulated out-of-phase with the first signal, a first feedback input, and a second feedback input. In these embodiments, the reconstruction filter includes first and second LC circuits for receiving the first and second signals respectively. These embodiments also include first and second feedback loops. The first feedback loop connects an output of the first LC circuit to the first feedback input. The second feedback loop connects an output of the second LC circuit to the second feedback input.

Yet other embodiments of the apparatus include first and second printed circuit boards. Class-D amplifiers are mounted on the first printed circuit board, and planar inductors are mounted on the second printed circuit board. These printed circuit boards are oriented perpendicular to each other.

In some embodiments, the first and second audio channels are configured such that cross-talk between the first and second channels is at least 54 dB below a signal level of the first audio channel at 10 kHz.

Among the embodiments of the apparatus are those in which the central axes of each of the first and second inductors are separated by no more than one body length.

In some embodiments, wherein the first and second planar inductors are mounted on a printed circuit board having conductive traces between the first and second planar inductors. In these embodiments, the first planar inductor has a first edge and the second planar inductor has a second edge facing the first edge and separated from it by no more than a width of the conductive trace.

In some embodiments, the first class-D amplifier is configured to operate in BD mode. Among these are those in which the first audio channel is configured to operate in differential mode at audio frequencies and in common mode at frequencies higher than the audio frequencies.

In another aspect, the invention features another apparatus for amplifying an audio signal. This apparatus includes first and second audio channels. The first audio channel has a first class-D amplifier for receiving an input signal, and a first reconstruction filter for receiving an output from the first class-D amplifier and reconstructing therefrom an output audio signal for driving the speaker system. The second audio channel has a second class-D amplifier for receiving an input audio signal, and a second reconstruction filter for receiving an output from the second class-D amplifier and reconstructing therefrom an output audio signal for driving the speaker system. The first and second reconstruction filters have corresponding first and second planar inductors. These planar inductors are magnetically coupled to each other. The apparatus further includes means for reducing signal distortion arising from this magnetic coupling between the first and second planar inductors.

Among the many embodiments of the foregoing apparatus are those in which the means for reducing signal distortion includes means for providing, to the first class-D amplifier, a feedback signal from the first reconstruction filter.

In yet another aspect, the invention features an apparatus for providing an audio signal to drive a speaker system. Such an apparatus includes a circuit having a planar inductor, as well as a first audio channel. The audio channel has a first class-D amplifier for receiving an input signal, and a first reconstruction filter for receiving an output from the first class-D amplifier and reconstructing therefrom an output audio signal for driving the speaker system. This first reconstruction filter includes a first planar inductor that is magnetically coupled to the planar inductor associated with the circuit.

There are numerous embodiments of the foregoing apparatus, some of which are listed below.

Among the many embodiments are those that include means for reducing signal distortion arising from the magnetic coupling between the first and second planar inductors.

In additional embodiments, the circuit having a first planar inductor includes a power supply for the first audio channel.

Other embodiments include a first feedback loop for providing a signal from an output of the first reconstruction filter back to the first class-D amplifier.

Also among the many embodiments of such an apparatus are those in which the first class-D amplifier includes a first output for providing a first signal, a second output for providing a second signal modulated out-of-phase with the first signal, a first feedback input, and a second feedback input. In such embodiments, the reconstruction filter includes first and second LC circuits for receiving the respective first and second signals, a first feedback loop connecting an output of the first LC circuit to the first feedback input; and a second feedback loop connecting an output of the second LC circuit to the second feedback input.

These and other features of the invention will be apparent from the following detailed description and the accompanying figures, in which:

DETAILED DESCRIPTION

A difficulty that arises with planar inductors that incorporate an air gap is the significant magnetic flux leakage that results from that air gap. As a result of this magnetic flux leakage, neighboring planar inductors can function essentially as a transformer. The magnetic coupling between the two inductors leads to cross-talk. In applications where such magnetic coupling is unwanted, one typically spaces planar inductors far from each other. Although this generous spacing between planar inductors does indeed reduce magnetic coupling between them, it also results in circuits having unacceptably large footprints.

In an audio amplifier with two or more independent channels, it is desirable to maintain cross-talk between channels at least 54 dB below the signal of interest in any one channel. When using planar inductors in the reconstruction filters of such amplifiers, it has been found desirable to space the planar inductors by at least three times the body length (i.e. the length of the low-reluctance structures 30, 32) of a planar inductor to weaken the magnetic coupling between adjacent inductors enough to reach this cross-talk level. This spacing results in unreasonably large audio amplifiers that are difficult to mount within the confined space of a typical motor vehicle. For this reason, class D audio amplifiers that rely on planar inductors in their reconstruction filters are typically restricted to being single channel amplifiers, such as bass amplifiers.

Figure 1:
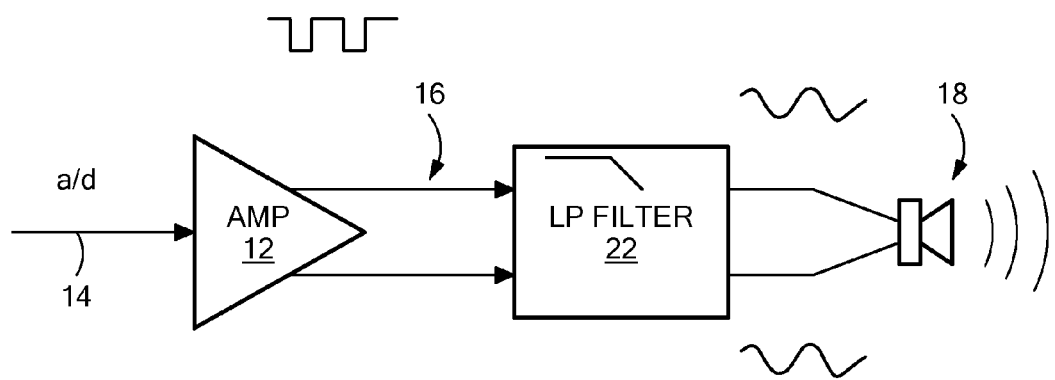
FIG. 1 shows a typical class-D audio amplifier system having an amplifier that both amplifies and modulates an input signal, and a reconstruction filter that a signal that can drive a speaker.
Figure 2:
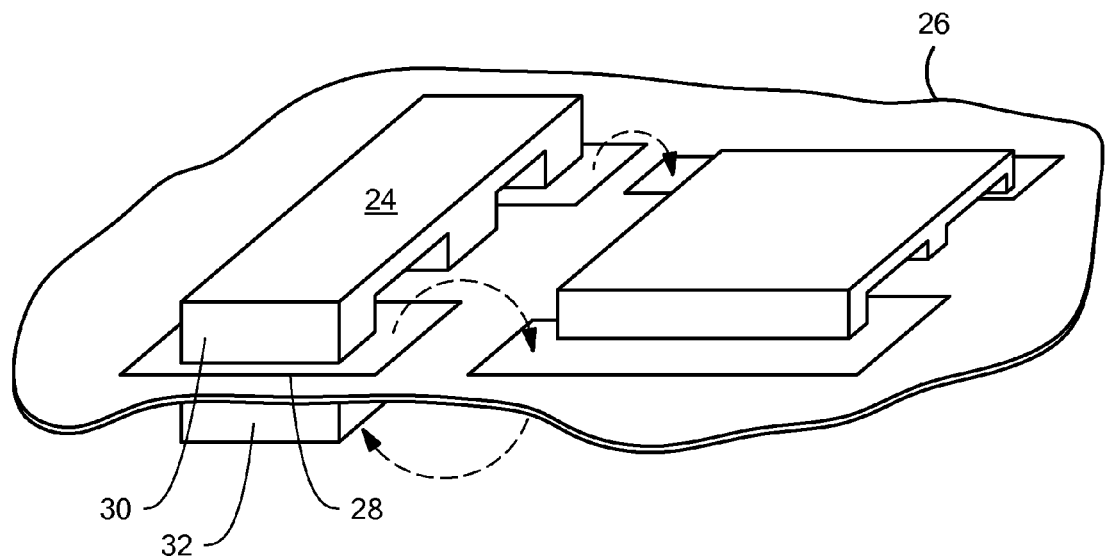
FIG. 2 shows a planar inductor for use in the reconstruction filter shown in FIG. 1.
Figure 3:
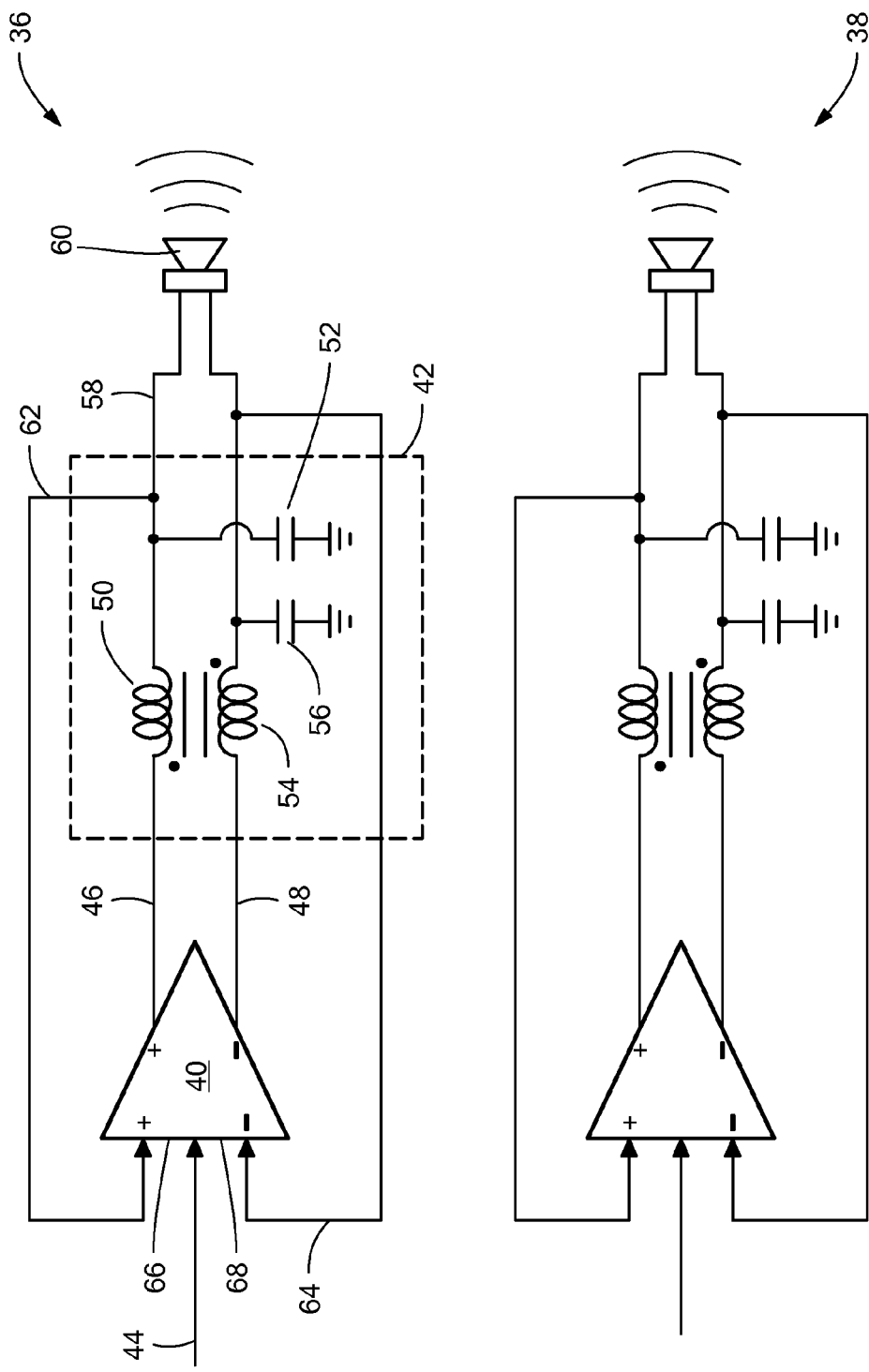
FIG. 3 shows a circuit with feedback loops to reduce coupling between planar inductors in neighboring audio channels.

FIG. 3 shows a multi-channel class D audio amplifier system having feedback loops configured to effectively reduce the effect of magnetic coupling between planar inductors in adjacent audio channels 36, 38. The presence of such feedback loops enables channels to be mounted closer to each other without introducing unacceptable cross-talk. This, in turn, enables one to construct compact multi-channel class D audio amplifier systems that can easily be mounted within the confined spaces of a motor vehicle.

Expressed differently, for any level of acceptable cross-talk, there exists a distance below which cross-talk becomes unacceptable. In the configuration shown in FIG. 3, this distance is smaller than it would have been in the absence of the illustrated feedback loops.

The illustrated system includes only first and second channels 36, 38 adjacent to each other. However, the principles described herein are applicable to any number of channels.

As is apparent from FIG. 3, the first and second channels 36, 38 have similar structures. Accordingly, only the first channel 36 is described in detail, with the understanding that other channels have similar construction.

The first channel 36 features a class-D audio amplifier 40 in series with a reconstruction filter 42. The class-D audio amplifier 40 accepts an audio signal 44, which can be digital or analog, and modulates the audio signal 44 to output first and second amplified pulse-coded versions of the audio signal, hereafter referred to the "amplifier output signals" 46, 48. The first and second class-D audio amplifier output signals 46, 48 are preferably modulated in-phase (class "BD" modulation) to reduce electromagnetic interference, to reduce pop noise during amplifier start-up and shut-down, and to cause the reconstruction filter 42 to work properly with center-pole gapped coupled planar inductor structures.

The amplifier output signals 46, 48 are provided to the reconstruction filter 42 (e.g., a low-pass filter).

At a minimum, the reconstruction filter 42 includes a first planar inductor 50 and a first capacitor 52 connected to form a first LC circuit for low-pass filtering the first amplifier output signal 46 and a second planar inductor 54 and a second capacitor 56 connected to form a second LC circuit for filtering the second amplifier output signal 48. This reconstruction filter 42 thus removes the high (i.e. RF) frequencies associated with the pulses in the amplifier output signals 46, 48, leaving behind a baseband amplified audio signal 58 that can then be used to drive a speaker 60.

Typical values of differential inductance of the first and second planar inductors 50, 54 are on the order of 10 microhenries. In one embodiment, the inductance is 10.7 microhenries measured at 10 kHz with 1 Vrms. Typical capacitance values for the first and second capacitors 52, 56 are on the order of 1 microfarad with a saturation current of 8 amps.

In some embodiments, the planar inductor is one of size EFR28 that uses 3C92 ferrite material, with a total air gap of 250 micrometers.

Each channel 36, 38 also includes first and second feedback loops 62, 64. The first feedback loop 62 provides a first signal to a first feedback input 66 in the class-D audio amplifier 40, while the second feedback loop 64 provides a second signal a second feedback input 68 in the class-D audio amplifier 40. The first and second signals are positive and negative outputs that are out of phase relative to each other.

The first and second feedback loops 62, 64 operate to correct errors arising from non-linearity at the audio output 58. As a result, the feedback loops 62, 64 can be used to correct for both total harmonic distortion, and distortion that arises from magnetic coupling of planar inductors in an adjacent channel 38. This, in turn, allows adjacent channels 36, 38 to be positioned closer to each other, resulting in an amplifier system 42 arranged in a physically smaller layout and low cost.

The circuit configuration shown in FIG. 3 enables the first audio channel 36 to function as a differential filter at audio range frequencies and as a common mode filter at RF frequencies. This arises in part because the planar inductor functions as a common mode filter that tends to block higher frequencies. As a result, these high frequency components tend to be attenuated more than they would be in more conventional approaches.

Figure 4:
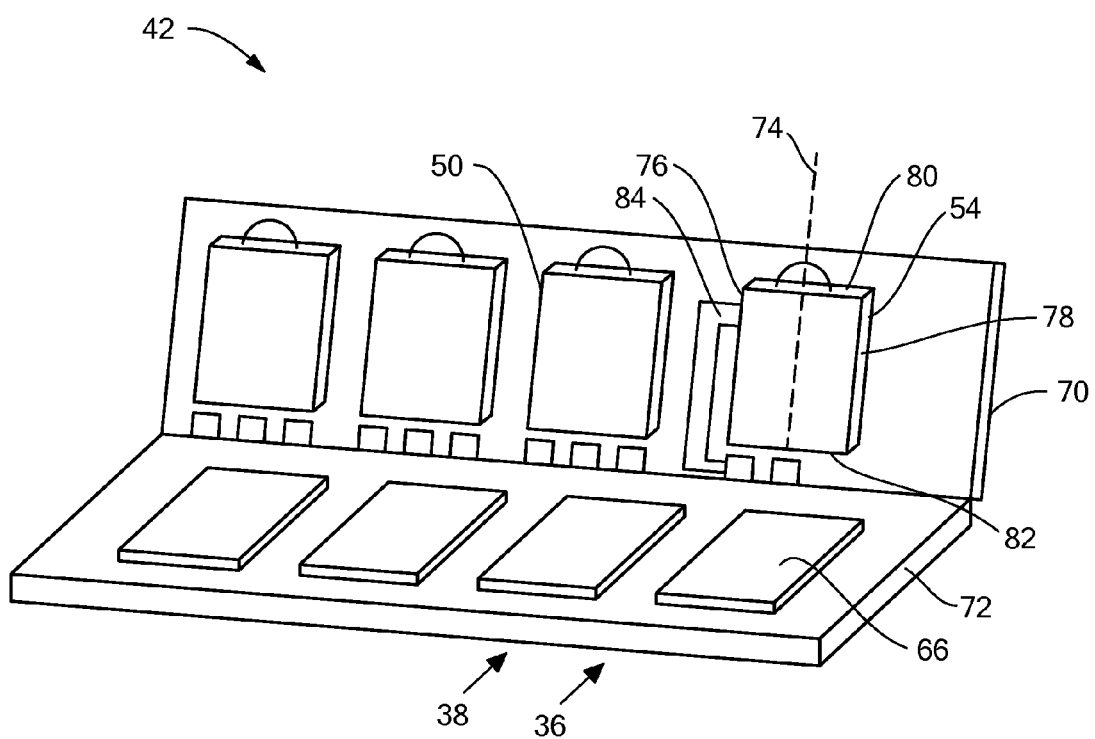
FIG. 4 shows one exemplary embodiment in which the planar inductors, rather than being on a main board as they are in other embodiments, are instead placed on a separate daughter board to further reduce amplifier footprint.

The configuration shown in FIG. 3 allows separate channels 36, 38 to share the same printed circuit board. However, the configuration shown in FIG. 3 also allows pairs of planar inductors 50, 54 from separate channels 36, 38 to be placed on a separate daughter board 70, as shown in FIG. 4, which can then be mounted perpendicular to the board 72 containing the class-D audio amplifiers 66 for each channel 36, 38. This further reduces the physical footprint of the overall amplifier system 42.

As shown in FIG. 4, each planar inductor 50, 54 has a central body axis 74, first and second edges 76, 78 that are parallel to this body axis 74, and third and fourth edges 80, 82 that are perpendicular to this body axis 74 and also to the first and second edges 76, 78. The third and fourth edges 80, 82 are separated by a body length. The planar inductors 50, 54 are separated from each other by a dimension that is less than this body length. Despite this small separation, the presence of the feedback loops 62, 64 shown in FIG. 3 prevents the magnetic coupling between planar inductors 50, 54 in FIG. 4 from exceeding 54 dB below the signal level of any audio channel 36, 38.

As is also apparent from FIG. 4, each pair of planar inductors 50, 54 is separated by no more than a width of a conductive trace 84 on the daughter board 74. Despite this small separation, the presence of the feedback loops 62, 64 shown in FIG. 3 prevents the magnetic coupling between planar inductors 50, 54 in FIG. 4 from exceeding 54 dB below the signal level of any audio channel 36, 38.

Figure 5:
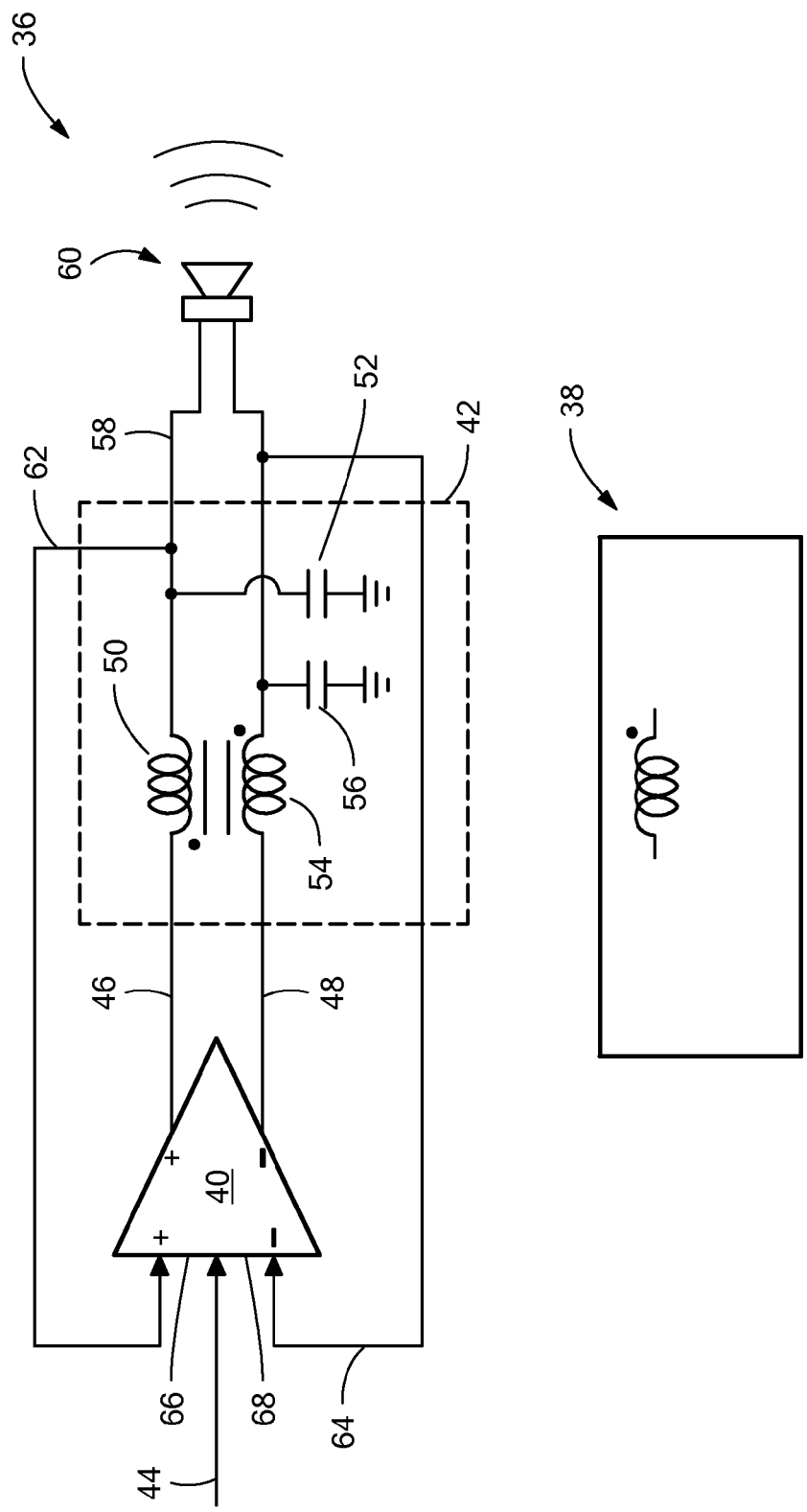
FIG. 5 shows a circuit with feed back loops to reduce coupling with planar inductors in a neighboring circuit.

The possibility of magnetic coupling, and its accompanying audio frequency distortion, arises when an audio channel having a planar inductor is mounted near any circuit that also includes planar inductors. Thus, the feedback mechanism described herein is applicable to cases in which the first channel 36 is mounted near another circuit that may not necessarily be another audio channel, but that may nevertheless include one or more planar inductors close enough to the audio channel to cause audible distortion. For example, as shown in FIG. 5, a circuit 38 mounted near the first channel 36 could be a power supply having one or more planar inductors that are close enough to magnetically couple to a planar inductor in the first channel 36.

Having described the invention, and a preferred embodiment thereof, what I claim as new, and secured by letters patent is:

1. An apparatus for providing an audio signal to drive a speaker system, said apparatus comprising:
    a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
    a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor; and
    a first feedback loop for providing a signal from an output of said first reconstruction filter back to said first class-D amplifier.

2. The apparatus of claim 1, further comprising a second feedback loop for providing a signal from an output of said second reconstruction filter back to said second class-D amplifier.

3. The apparatus of claim 1, further comprising means for reducing distortion due to magnetic coupling between said first and second planar inductors.

4. The apparatus of claim 1, wherein said first and second audio channels are configured such that cross-talk between said first and second channels is at least 54 dB below a signal level of said first audio channel at 10 kHz.

5. The apparatus of claim 1, wherein said first class-D amplifier is configured to operate in BD mode.

6. The apparatus of claim 5, wherein said first audio channel is configured to operate in differential mode at audio frequencies and in common mode at frequencies higher than said audio frequencies.

7. An apparatus for providing an audio signal to drive a speaker system, said apparatus comprising:
    a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
    a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor; and
    means for reducing distortion due to magnetic coupling between said first and second planar inductors,
    wherein said means for reducing distortion comprises means for providing feedback from said first reconstruction filter to said first class-D amplifier.

8. The apparatus of claim 7, wherein said means for reducing distortion further comprises means for providing feedback from said second reconstruction filter to said second class-D amplifier.

9. An apparatus for providing an audio signal to drive a speaker system, said apparatus comprising:
a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor,
wherein said first class-D amplifier includes a first output for providing a first signal, a second output for providing a second signal modulated out-of-phase with said first signal, a first feedback input, and a second feedback input, and
wherein said first reconstruction filter includes a first LC circuit for receiving said first signal, and a second LC circuit for receiving said second signal;
said apparatus further comprising a first feedback loop connecting an output of said first LC circuit to said first feedback input; and a second feedback loop connecting an output of said second LC circuit to said second feedback input.

10. An apparatus for providing an audio signal to drive a speaker system, said apparatus comprising:
a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor;
a first printed circuit board on which are mounted said class-D amplifiers; and
a second printed circuit board on which are mounted said planar inductors, said second printed circuit board being oriented perpendicular to said first printed circuit board.

11. An apparatus for providing an audio signal to drive a speaker system, said apparatus comprising:
a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor,
wherein said first and second planar inductors each have a body length and a central axis, and wherein said central axes of each of said first and second inductors are separated by no more than one body length.

12. An apparatus for providing an audio signal to drive a speaker system, said apparatus comprising:
a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor,
wherein said first and second planar inductors are mounted on a printed circuit board having conductive traces between said first and second planar inductors, wherein said first planar inductor has a first edge and said second planar inductor has a second edge facing said first edge, and wherein said first and second edges are separated by no more than a width of said conductive trace.

13. An apparatus for amplifying an audio signal, said apparatus comprising:
a first audio channel having a first class-D amplifier for receiving an input signal, and a first reconstruction filter for receiving an output from said first class-D amplifier and reconstructing therefrom an output audio signal for driving said speaker system, said first reconstruction filter including a first planar inductor;
a second audio channel having a second class-D amplifier for receiving an input audio signal, and a second reconstruction filter for receiving an output from said second class-D amplifier and reconstructing therefrom an output audio signal for driving said speaker system, said second reconstruction filter including a second planar inductor, said second planar inductor being magnetically coupled to said first planar inductor; and
means for reducing signal distortion arising from said magnetic coupling between said first and second planar inductors,
wherein said means for reducing signal distortion comprises means for providing, to said first class-D amplifier, a feedback signal from said first reconstruction filter.

14. An apparatus for providing an audio signal to drive a speaker system, said apparatus comprising:
a circuit having a first planar inductor, a first audio channel having a first class-D amplifier for receiving an input signal, and a first reconstruction filter for receiving an output from said first class-D amplifier and reconstructing therefrom an output audio signal for driving said speaker system, said first reconstruction filter including a second planar inductor, said second planar inductor being magnetically coupled to said first planar inductor; and
a first feedback loop for providing a signal from an output of said first reconstruction filter back to said first class-D amplifier.

15. The apparatus of claim 14, further comprising means for reducing signal distortion arising from said magnetic coupling between said first and second planar inductors.

16. The apparatus of claim 14, wherein said circuit having a planar inductor comprises a power supply for said first audio channel.

17. An apparatus for providing an audio signal to drive a speaker system, said apparatus comprising:
- a circuit having a first planar inductor, a first audio channel having a first class-D amplifier for receiving an input signal, and a first reconstruction filter for receiving an output from said first class-D amplifier and reconstructing therefrom an output audio signal for driving said speaker system, said first reconstruction filter including a second planar inductor, said second planar inductor being magnetically coupled to said first planar inductor,
- wherein said first class-D amplifier includes a first output for providing a first signal, a second output for providing a second signal modulated out-of-phase with said first signal, a first feedback input, and a second feedback input,
- wherein said reconstruction filter includes a first LC circuit for receiving said first signal, and a second LC circuit for receiving said second signal,
- said apparatus further comprising a first feedback loop connecting an output of said first LC circuit to said first feedback input; and
- second feedback loop connecting an output of said second LC circuit to said second feedback input.

* * * * *